(12) United States Patent
Margutti et al.

(10) Patent No.: US 9,153,615 B2
(45) Date of Patent: Oct. 6, 2015

(54) METHOD OF FABRICATION OF AN ARRAY OF GRADED REFRACTIVE INDEX MICROLENSES INTEGRATED IN AN IMAGE SENSOR

(71) Applicant: Semiconductor Components Industries, LLC, Phoenix, AZ (US)

(72) Inventors: Giovanni Margutti, Avezzano (IT); Andrea Del Monte, Pomezia (IT)

(73) Assignee: Semiconductor Components Industries, LLC, Phoenix, AZ (US)

( * ) Notice: Subject to any disclaimer, the term of this patent is extended or adjusted under 35 U.S.C. 154(b) by 19 days.

(21) Appl. No.: 14/281,263

(22) Filed: May 19, 2014

(65) Prior Publication Data

US 2014/0302632 A1 Oct. 9, 2014

Related U.S. Application Data

(62) Division of application No. 13/306,094, filed on Nov. 29, 2011, now Pat. No. 8,748,953.

(60) Provisional application No. 61/489,393, filed on May 24, 2011.

(51) Int. Cl.
*H01L 21/00* (2006.01)
*H01L 27/146* (2006.01)
*H01L 31/0232* (2014.01)

(52) U.S. Cl.
CPC .... *H01L 27/14627* (2013.01); *H01L 27/14685* (2013.01); *H01L 27/14689* (2013.01); *H01L 31/02327* (2013.01)

(58) Field of Classification Search
CPC ................. H01L 21/823406; H01L 21/76825; H01L 21/2254; H01L 21/28123
USPC .................................................. 257/290–295
See application file for complete search history.

(56) References Cited

U.S. PATENT DOCUMENTS

| | | | |
|---|---|---|---|
| 6,127,668 A | 10/2000 | Baek | |
| 2010/0065897 A1* | 3/2010 | Jun | ............................... 257/294 |
| 2011/0127628 A1 | 6/2011 | Margutti | |

* cited by examiner

*Primary Examiner* — Elias M Ullah
(74) *Attorney, Agent, or Firm* — Kendall P. Woodruff

(57) ABSTRACT

Methods and devices that incorporate microlens arrays are disclosed. An image sensor includes a pixel layer and a dielectric layer. The pixel layer has a photodetector portion configured to convert light absorbed by the pixel layer into an electrical signal. The dielectric layer is formed on a surface of the pixel layer. The dielectric layer has a refractive index that varies along a length of the dielectric layer. A method for fabricating an image sensor includes forming an array of microlenses on a surface of the dielectric layer, emitting ions through the array of microlenses to implant the ions in the dielectric layer, and removing the array of microlenses from the surface of the dielectric layer.

8 Claims, 6 Drawing Sheets

METHOD OF FABRICATION OF AN ARRAY OF GRADED REFRACTIVE INDEX MICROLENSES INTEGRATED IN AN IMAGE SENSOR

CROSS REFERENCE TO RELATED APPLICATIONS

This application is a division of patent application Ser. No. 13/306,094, filed Nov. 29, 2011, which claims the benefit of provisional patent application No. 61/489,393, filed May 24, 2011, which are hereby incorporated by reference herein in their entireties. This application claims the benefit of and claims priority to patent application Ser. No. 13/306,094, filed Nov. 29, 2011, and provisional patent application No. 61/489,393, filed May 24, 2011.

FIELD OF THE INVENTION

The present invention relates generally to imaging devices, and more particularly, to imaging devices incorporating microlens arrays.

BACKGROUND OF THE INVENTION

Image sensors convert optical light to an electrical signal. Conventional image sensors are used predominantly in digital cameras, and may fall into one of two categories: charge-coupled device (CCD) image sensors and complementary metal-oxide-semiconductor (CMOS) image sensors.

Image sensors are formed from an array of pixels, each of which is converts received light into an electrical signal. Image sensors may include arrays of microlenses positioned above the pixels in order to focus the light received by the pixel. The effectiveness of a pixel at converting received light into an electrical signal is dependent at least in part on the amount of light received in the photodetector region of the pixel. Thus, improvements are desired that focus light toward the photodetector region of a pixel.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. According to common practice, the various features of the drawings are not drawn to scale unless otherwise indicated. To the contrary, the dimensions of the various features may be expanded or reduced for clarity. Included in the drawings are the following figures.

DETAILED DESCRIPTION OF THE INVENTION

The image sensors described herein are usable for a variety of electronic devices including, for example, digital cameras. The disclosed image sensors and methods achieve improvements in focusing light received by the image sensor pixels.

The example embodiments disclosed herein are particularly suitable for use in conjunction with complementary metal-oxide-semiconductor (CMOS) image sensors. Nonetheless, while the example embodiments of the present invention are described herein in the context of CMOS image sensors, it will be understood by one of ordinary skill in the art that the invention is not so limited.

Figure 1:
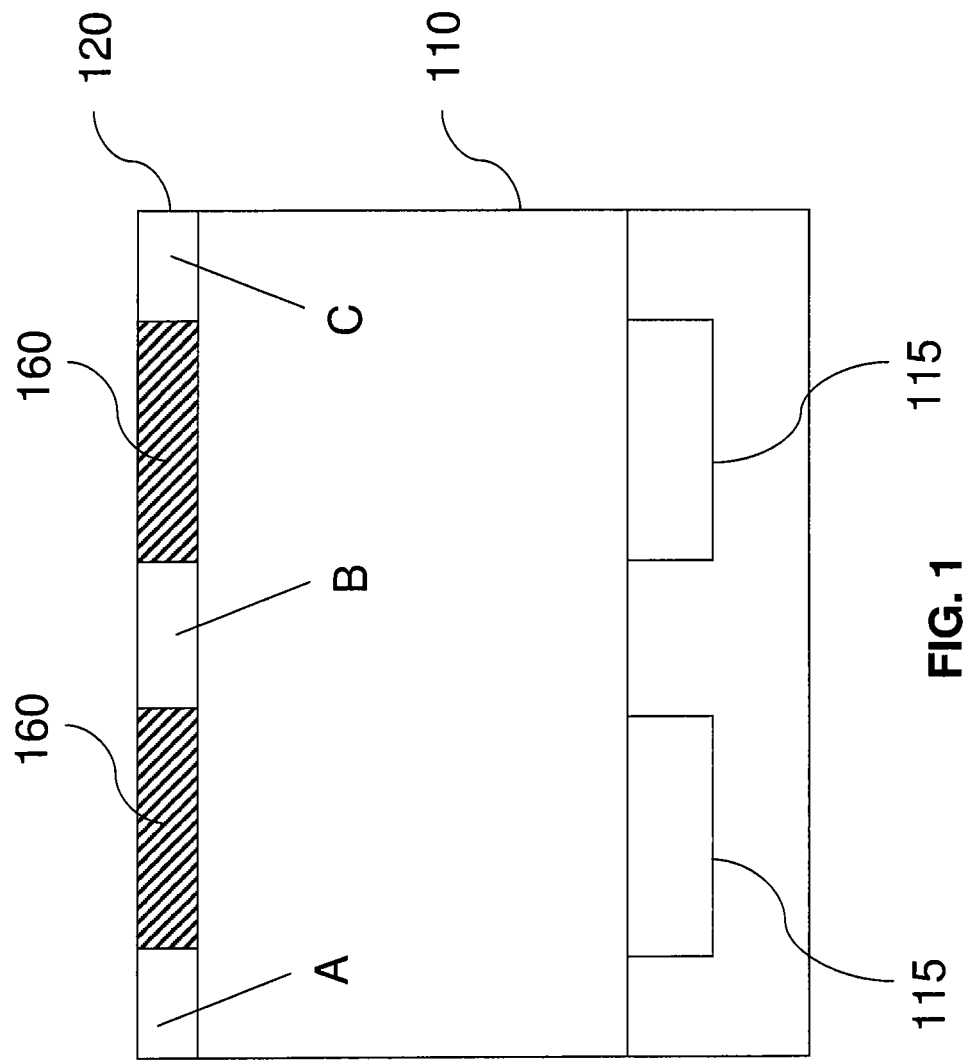
FIG. 1 is a cross-sectional diagram illustrating an example image sensor in accordance with aspects of the present invention.

Referring now to the drawings, FIG. 1 illustrates an example image sensor 100 in accordance with aspects of the present invention. Image sensor 100 may be part of an electronic device such as, for example, a digital camera. As a general overview, image sensor 100 includes a pixel layer 110 and a dielectric layer 120. Additional details of image sensor 100 are described below.

Pixel layer 110 converts light received by the image sensor 100 into an electric signal. In particular, pixel layer 110 includes photodetector portions 115 that are configured to convert light absorbed by pixel layer 110 into the electrical signal. Briefly, a semiconductor p-n junction diode is often used for the detection of light signals. The p-n junction is typically reverse biased, creating a depletion region in a volume surrounding the p-n junction. As such, light illuminating the p-n junction cause electrons in the valance band of the semiconductor material to transition into the conduction band, generating hole-electron pairs in the depletion region which are swept out of the depletion region in opposite directions. A change in junction potential due to collapse of the depletion region is detected as the signal indicative of the intensity of the light absorbed by pixel layer 110.

A p-n junction diode intended for use as a photodetector is often referred to as a photodiode. Various physical mechanisms act to limit the ability of the photodiode and photodiode arrays to detect and specially resolve low levels of light. Important among these mechanisms are noise, surface reflectivity, leakage currents, and cross-talk. Noise may be due to random fluctuations in light signal intensity, thermal mechanisms, and other causes. Other characteristics of the photodiode, such as depth of the junction below the semiconductor surface and width of depletion region, also influence the sensitivity of the photodiode to the incident light.

Dielectric layer 120 is formed on a surface of pixel layer 110. Dielectric layer 120 may be formed on the front surface or the back surface of pixel layer 110 relative to a source of the light absorbed by respective photodetector portions 115 of pixel layer 110. In an example embodiment, dielectric layer 120 is a silicon nitride passivation layer deposited on the surface of pixel layer 110. However, it will be understood by one of ordinary skill in the art from the description herein that dielectric layer 120 may be any layer of material formed on a surface of pixel layer 110 during fabrication of image sensor 100.

Suitable processes for the fabrication of pixel layer 110 and the base material of dielectric layer 120 are described, for example, in U.S. Patent Application Publication No. 2010/01640428 to Manabe, the contents of which are incorporated herein by reference for their teaching on the fabrication of image sensors and pixels. Additional processes for completing the fabrication of dielectric layer 120 are described in greater detail below.

Dielectric layer 120 performs the function of a microlens array in image sensor 100. Dielectric layer 120 has a refractive index that varies along a length of dielectric layer 120. The refractive index of dielectric layer 120 may vary periodically (e.g., like a sine wave) as one follows dielectric layer 120 from pixel to pixel across a surface of pixel layer 110. Desirably, the refractive index of dielectric layer 120 reaches a relative maximum value at areas centered above the respective photodetector portions 115 in pixel layer 110, in order to focus the light received by image sensor 100 on the photodetector portions 115.

In an example embodiment, dielectric layer 120 includes regions of implanted ions 160 in a base material of the dielectric layer 120. The implanted ion regions 160 cause the variance in the refractive index of dielectric layer 120 by changing the optical properties of the base material of the dielectric layer 120. The pattern of the implanted ion regions 160 is dependent on the positions of the photodetector portions 115 in pixel layer 110, and on the materials of both the implanted ions and the dielectric layer 120, as set forth below.

Figure 2:
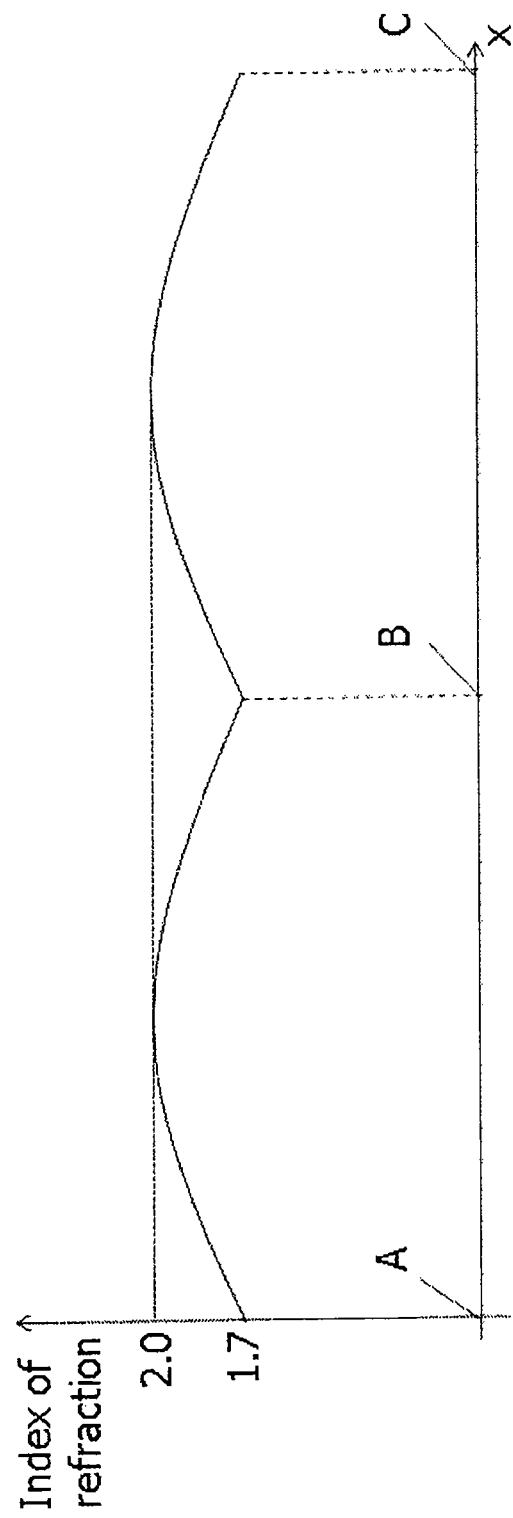
FIG. 2 is a chart illustrating an example refractive index for a dielectric layer of the image sensor of FIG. 1.

For one example, the implanted ions may increase the refractive index of the base material. As shown in FIG. 1, the implanted ion regions 160 are centered above respective photodetector portions 115 in pixel layer 110 (i.e. between points A, B, and C in FIG. 1), in order to focus the light received by image sensor 100 on the photodetector portions. As shown in FIG. 2, the implanted ion regions 160 increase the refractive index of dielectric layer 120 in the areas above respective photodetector portions 115 (i.e. between corresponding points A, B, and C in FIG. 2).

For another example, the implanted ions may decrease the refractive index of the base material. The implanted ions in this example may comprise argon, and the base material may comprise silicon nitride. In this example, the implanted ion regions 160 may be centered at the boundaries or edges between respective photodetector portions 115 in pixel layer 110, in order to focus the light received by image sensor 100 on the photodetector portions.

It will be understood that the above embodiments are illustrative of suitable materials for use in dielectric layer 120, and are not intended to be limiting. Other suitable base materials include, for example, silicon oxide, silicon carbide, or SiCN. Other suitable ions for implantation in the base material include, for example, nitrogen, fluorine, or germanium.

Figure 3:
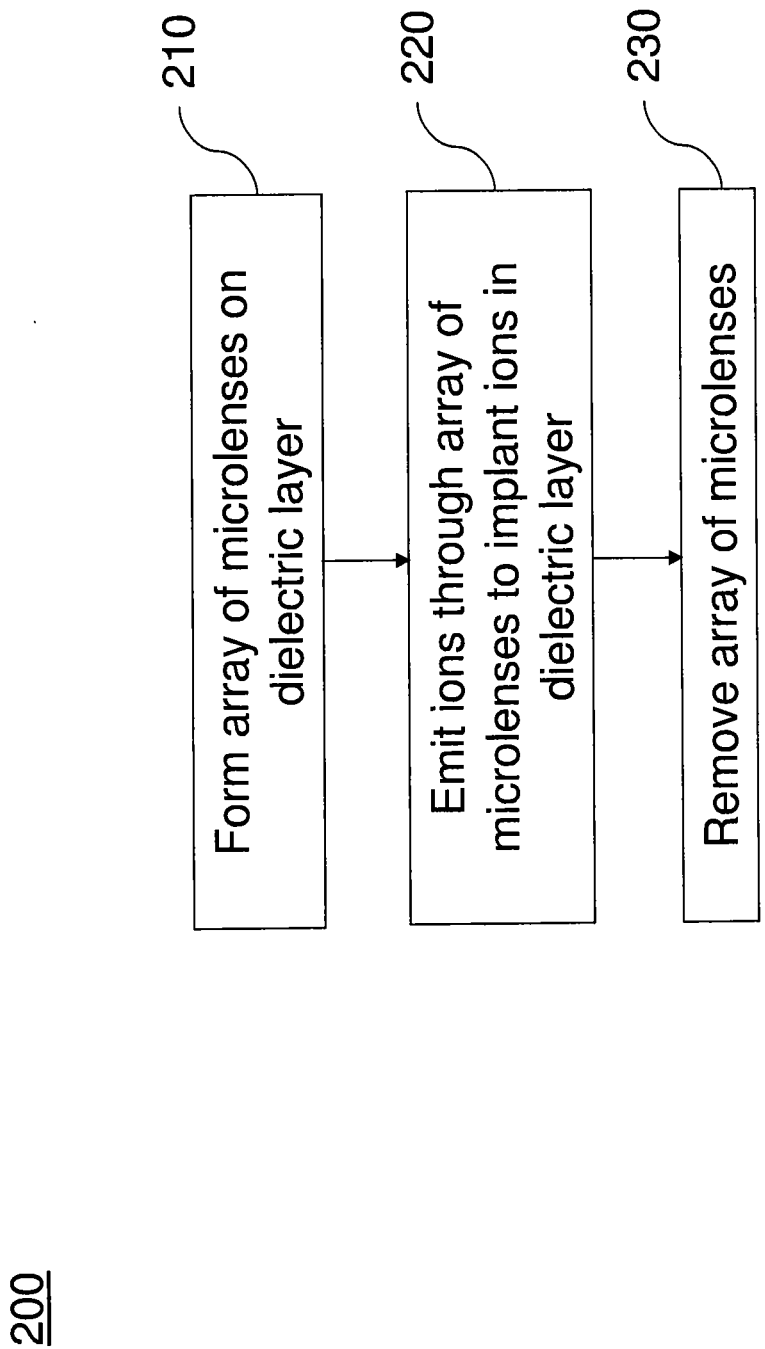
FIG. 3 is a flowchart illustrating an example method for fabricating an image sensor in accordance with aspects of the present invention.

FIG. 3 is a flowchart illustrating an example method 200 for fabricating an image sensor in accordance with aspects of the present invention. The image sensor includes a pixel layer and a dielectric layer formed on the pixel layer. Method 200 may desirably be implemented, for example, to form a CMOS image sensor for a digital camera. As a general overview, method 200 includes forming an array of microlenses, emitting ions through the array, and removing the array. Additional details of method 200 are described herein with respect to the components of image sensor 100.

Figure 4:
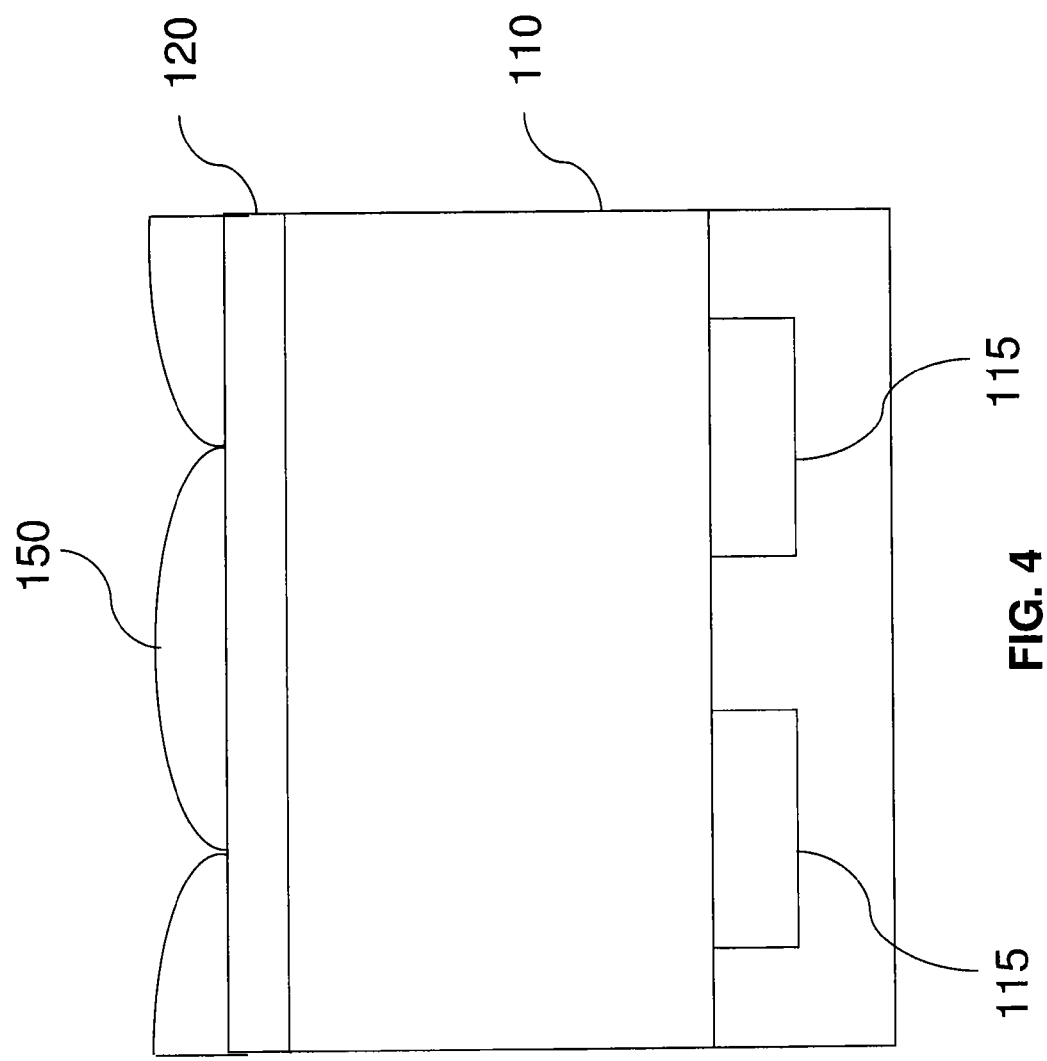
FIG. 4 is a diagram illustrating an example forming step of the method of FIG. 3.

In step 210, an array of microlenses is formed. In an example embodiment, an array of microlenses 150 is formed on a surface of dielectric layer 120, as shown in FIG. 4. Microlens array 150 may comprise microlenses formed from a polymer material such as conventional photoresist material used for microlens fabrication. Microlens array 150 may be formed by conventional photolithographic processes, as would be understood to one of ordinary skill in the art. Briefly, a heat-curable polymer is coated on the surface of the dielectric layer in liquid form. The polymer forms the lens shapes by means of the thermal process that causes the modification of the surface profile. The lens shapes are then set through heat curing process.

Figure 5:
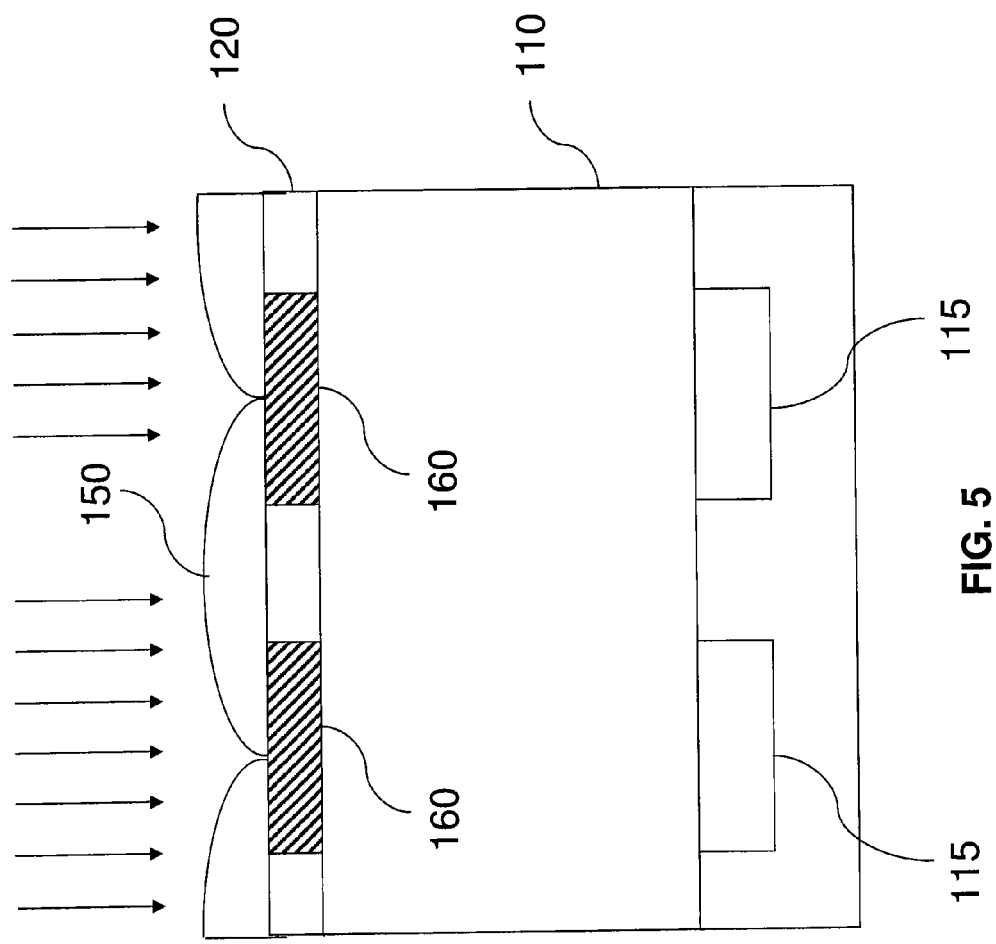
FIG. 5 is a diagram illustrating an example emitting step of the method of FIG. 3.

In step 220, ions are emitted through the array of microlenses. In an example embodiment, ions are emitted through the array of microlenses 150 to form implanted ion regions 160 in dielectric layer 120, as shown in FIG. 5. The ions may be, for example, argon ions. The ions may desirably be emitted in a direction normal to the surface of dielectric layer 120. However, ions may alternatively be emitted at an oblique angle relative to the surface of dielectric layer 120. The ions are emitted with the proper energy and density to penetrate through the microlens array 150 and into dielectric layer 120. For example, the ions may be emitted with an energy of approximately 30 keV. The microlens array 150 impedes the ions such that fewer ions are implanted beneath the thicker regions of microlens array 150 and more ions are implanted beneath the thinner regions of microlens array 150.

The formation of microlens array 150 changes the reflective profile of image sensor 100. Thus, during step 220, microlens array 150 acts as a screen for the implantation of ions in dielectric layer 120. The degree to which ions are implanted in dielectric layer 120 varies based on the positioning and thickness of microlens array 150.

In one embodiment, microlens array 150 is formed in step 210 such that the points of minimum thickness of the array are centered above respective photodetector portions of pixel layer 110. In this embodiment, areas of dielectric layer 120 above respective photodetector portions would experience the most ion implantation during step 220. In another embodiment, microlens array 150 is formed in step 210 such that the points of maximum thickness of the array are centered above respective photodetector portions of pixel layer 110. In this embodiment, areas of dielectric layer 120 above respective photodetector portions would experience the least ion implantation during step 220. In this way, the positioning and concentration of implanted ion regions 160 in dielectric layer 120 may be controlled by the positioning and thickness of microlens array 150 formed during step 210.

Figure 6:
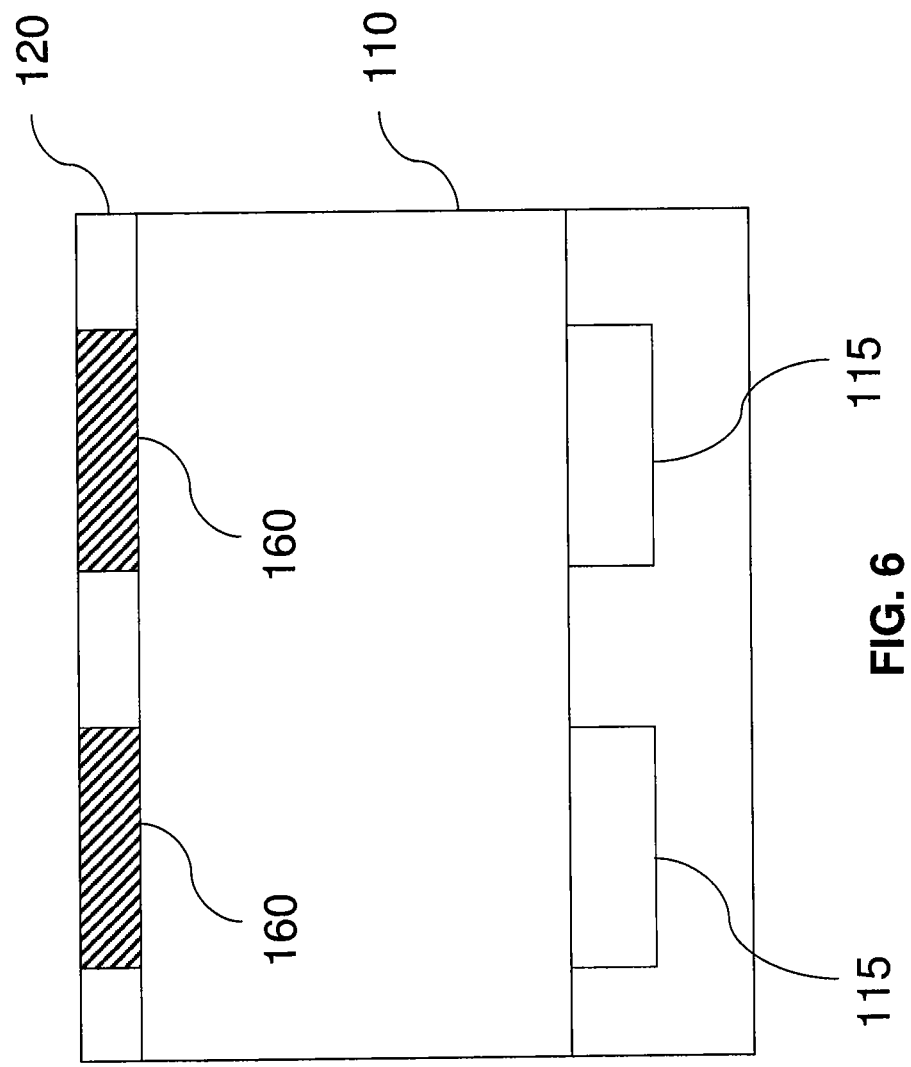
FIG. 6 is a diagram illustrating an example removing step of the method of FIG. 3.

In step 230, the array of microlenses is removed. In an example embodiment, microlens array 150 is removed from the surface of dielectric layer 120, as shown in FIG. 6. Microlens array 150 may be removed by conventional photolithographic processes such as wet cleaning or ashing, as would be understood to one of ordinary skill in the art.

The resulting dielectric layer 120 has implanted ion regions 160 in a pattern corresponding to that of a microlens array. The implantation of ions in the base material of dielectric layer 120 physically damages the material, thereby changing its refractive index. Because the implanted ion regions 160 change the refractive index of the base material of dielectric layer 120, the dielectric layer 120 of the present invention performs the function of a microlens array in image sensor 100.

Aspects of the present invention relate to methods and devices that incorporate microlens arrays.

According to one aspect of the present invention, a method for fabricating an image sensor is disclosed. The image sensor has a pixel layer and a dielectric layer. the method comprising the steps of forming an array of microlenses on a surface of the dielectric layer, emitting ions through the array of microlenses to implant the ions in the dielectric layer, and removing the array of microlenses from the surface of the dielectric layer.

According to another aspect of the present invention, an image sensor is disclosed. The image sensor includes a pixel layer having a photodetector portion configured to convert light absorbed by the pixel layer into an electrical signal. The image sensor also includes a dielectric layer formed on a surface of the pixel layer. The dielectric layer has a refractive index that varies along a length of the dielectric layer.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for fabricating an image sensor, the image sensor comprising a pixel layer and a dielectric layer, the method comprising the steps of:
    forming an array of microlenses on a surface of the dielectric layer wherein the ions are aligned with photodetectors in the pixel layer;
    emitting ions through the array of microlenses to implant the ions in the dielectric layer; and
    removing the array of microlenses from the surface of the dielectric layer.

2. The method of claim 1, wherein the forming step comprises:
    forming an array of polymer microlenses.

3. The method of claim 1, wherein the forming step comprises:
    forming the array of microlenses such that points of minimum thickness of the array are centered above respective photodetector portions of the pixel layer.

4. The method of claim 1, wherein the forming step comprises:
    forming the array of microlenses such that points of maximum thickness of the array are centered above respective photodetector portions of the pixel layer.

5. The method of claim 1, wherein the emitting step comprises:
    emitting the ions in a direction normal to the surface of the dielectric layer.

6. The method of claim 1, wherein the emitting step comprises:
    emitting the ions in a direction oblique to the surface of the dielectric layer.

7. The method of claim 1, wherein the emitting step comprises:
    emitting ions with an energy of approximately 30 keV.

8. The method of claim 1, wherein the dielectric layer comprises silicon nitride and the emitting step comprises emitting argon ions.

* * * * *